Nov. 5, 1957 V. A. MISEK 2,812,496

BALANCED MODULATOR AND OSCILLATOR

Filed Jan. 19, 1955

Victor A. Misek
INVENTOR.
BY [signature]
Attorney 2,812,496

BALANCED MODULATOR AND OSCILLATOR

Victor A. Misek, Nashua, N. H., assignor, by mesne assignments, to Sanders Associates, Inc., Nashua, N. H., a corporation of Delaware Application January 19, 1955, Serial No. 482,825

5 Claims. (Cl. 332—14)

Figure 1:
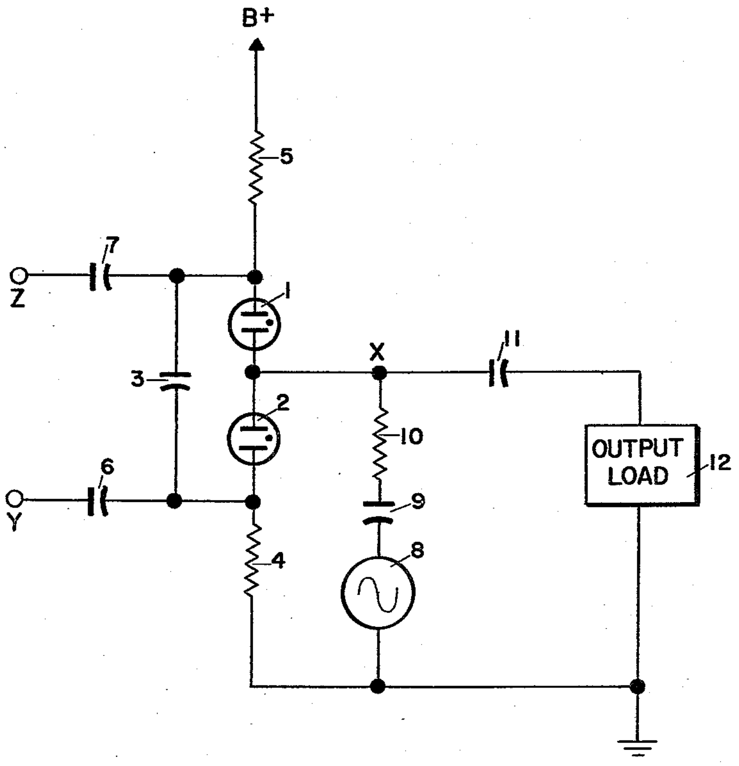

This invention relates to modulation devices. More particularly, the present invention relates to balanced modulators such as are used to produce suppressed carrier modulation.

In the prior art many devices have been proposed for developing amplitude modulated carrier waves wherein only the sideband frequencies, carrying the information, appear in the output and the original carrier signal is substantially eliminated or suppressed. These devices are ordinarily characterized by relatively complex structure and design in that a number of unilateral impedance devices are required.

It is therefor an object of the present invention to provide an improved oscillator and balanced modulator utilizing bistable impedance means to provide suppressed carrier modulation.

A further object of the invention is to provide an improved oscillator and balanced modulator utilizing diode gas discharge electron tubes to provide suppressed carrier modulation.

A still further object of the invention is to provide an improved oscillator and balanced modulator which is adapted to be synchronized with an external reference signal.

A still further object of the invention is to provide an improved balanced modulator of the character described which is economical in its construction and inherently stable in its operation.

Other and further objects of the invention will be apparent from the following description of a preferred embodiment thereof, taken in connection with the accompanying drawings.

In accordance with the present invention there is provided a suppressed carrier modulation device comprising a modulation means providing a modulation signal. A pair of bistable impedance means are connected together in series and in series with a source of direct voltage. Impedance switching means are provided in series with the direct voltage and control its application across the bistable impedance means. The switching impedance means is connected in parallel with the bistable impedance means forming an oscillator therewith, providing a source of carrier signal having a greater frequency than the modulation signal. Output load means are connected to the impedance means and the modulation means to provide an output signal characterized by frequencies consisting of the sum of the carrier and modulation frequencies and the difference between the carrier and modulation frequency.

In the preferred embodiment there is provided a suppressed carrier modulation device comprising a source of modulation signal and a source of unidirectional voltage. A pair of series connected diode gas discharge electron tubes are also provided. A first impedance means is connected in series with and between one of the tubes and the voltage source. A second impedance means is connected in series with and between the other of said tubes and said voltage source. A capacitor is connected in parallel with the impedance means forming a relaxation oscillator therewith, to provide a source of carrier signal having a greater frequency than the modulation signal. A second capacitor is connected to the source of modulation signal. Modulation impedance means are connected in series with and between the second capacitor and the junction between the diodes. The device includes output load means. A capacitor connects the output load means to the junction between the diodes and the modulation impedance means to provide an output signal characterized by frequencies consisting of the sum of the carrier and modulation frequencies and the difference between the carrier and modulation frequencies. Capacitor means are connected to the tubes and adapted to synchronize the oscillator with a predetermined reference signal.

Figure 2:
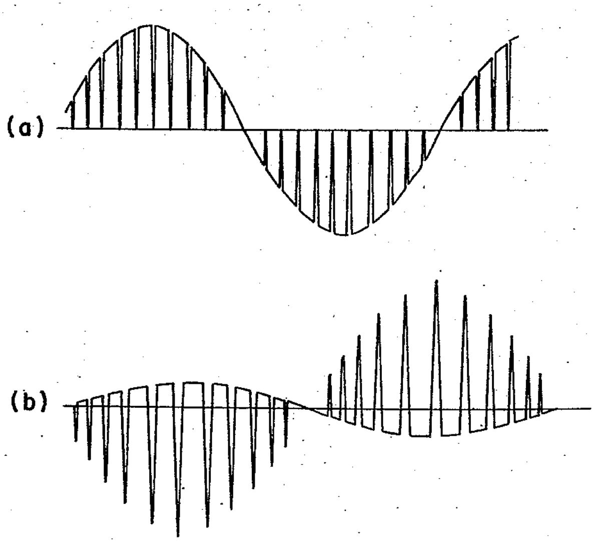

In the accompanying drawings, Fig. 1 is a schematic circuit diagram of a preferred embodiment of the present invention; and Fig. 2 presents graphs of voltage wave forms associated with the operation of the present invention.

Referring now to the drawings and with particular reference to Fig. 1, a pair of bistable impedance means, more specifically diode gas discharge electron tubes 1 and 2, are connected together in series as shown. The term "bistable" herein implies two stable operating conditions which are dependent upon the voltage which appears across the impedance. Thus, in the case of a gas discharge tube, bistable refers to the discharge or conductive phase and the open circuit or non-conductive phase. A switching impedance means, capacitor 3, is connected in parallel with the tubes 1 and 2, as shown, which are in series with a source of direct voltage (a relatively high positive voltage labeled B+). Impedance means, here shown as resistors 4 and 5, are connected in series between the diodes and the voltage source B+, as illustrated. In the preferred embodiment the resistors 4 and 5 have equal impedance values. The capacitor 3, the diodes 1 and 2, the resistors 4 and 5, and the source of direct voltage form a relaxation oscillator producing sawtooth voltage wave forms across the capacitor 3. The oscillator provides a carrier signal $F_c$.

A modulation means, here shown as a modulation signal generator 8, provides a modulation signal $F_m$. The frequency of the carrier signal $F_c$ is greater than the modulation signal $F_m$. A capacitor 9 couples the generator 8 through a modulation impedance, here, a resistor 10, to a junction point X between the diodes 1 and 2. In the preferred embodiment, the resistance of the resistor 10 is much greater than that of the resistors 4 and 5. A capacitor 11 couples the junction point X to an output load 12 which is connected to ground as shown. The relaxation oscillator may be synchronized with an external reference signal which is introduced between terminal Z and ground through a capacitor 7. The oscillator may also be synchronized by a reference signal which is introduced between a terminal Y and ground through a capacitor 6.

Referring now to Figs. 1 and 2, the operation of the invention will be described. As noted above, the diodes 1 and 2, the capacitor 3, the resistors 4 and 5, and the source of supply voltage form a relaxation oscillator circuit providing a source of carrier signal $F_c$. When the capacitor 3 charges up to the full supply voltage it continues to charge until such time as the firing potential of the series diodes 1 and 2 is reached. At that time, the diodes 1 and 2 conduct heavily and the capacitor 3 discharges therethrough. When the voltage across the capacitor 3 is less than that necessary to maintain the diodes 1 and 2 conductive, they become open circuited. It will be apparent that the capacitor 3 comprises a switching impedance means adapted to control the conduction or non-conduction of the diodes 1 and 2. The direct voltage at the point X is normally equal to one half the supply voltage, since the resistors 4 and 5 and diodes 1 and 2 form a symmetrical voltage dividing circuit. A modulation signal provided by the generator 8 is coupled through capacitor 9 and resistor 10 to add to and subtract from the direct voltage appearing at the point X at a lesser frequency than that of the carrier signal $F_c$. The modulation signal is coupled through the capacitor 11 and appears across the output load 12. During the conduction phase of the diode 2, the voltage at the point X remains substantially one half the supply voltage since the shunt impedance presented by the diode 2 and resistor 4 is relatively low compared to that of the resistor 10.

The curve (*a*) of Fig. 2 is a graph of voltage wave forms a point X and illustrates the voltage pulses obtained by the effective switching action of the diode 2 at the frequency of the carrier signal. When the voltage at the point X is coupled through capacitor 11, the direct voltage component is removed. The output signal appearing across the output load 12 alternates in polarity with respect to ground, as shown in the curve (*b*) of Fig. 2.

It is characteristic of the instant device that the carrier input signal $F_c$ and the modulation signal $F_m$ are suppressed in the output of the device. Only the sideband frequencies, $F_c-F_m$ and $F_c+F_m$, appear in the output.

In an embodiment of the invention which was actually constructed and tested, a carrier signal amplitude of 50 volts peak was used at a frequency of 300 cycles. The resistors 4 and 5 were each 1.2 megohms. Neon bulbs NE2 were used for the diodes 1 and 2. The resistor 10 was 5 megohms. The capacitor 9 was 0.1 microfarad; the capacitor 11 was 0.001 microfarad; capacitors 6 and 7, 10 micro-microfarads; and the capacitor 3, 910 micro-microfarads. The amplitude of the modulation signal was 5 volts at a frequency of 60 cycles. The supply voltage (B+) was 200 volts. A 10,000 ohms resistor was used for the output load.

The present invention greatly enhances the use and application of balanced modulator devices, particularly for servo system modulator purposes.

While there has been hereinbefore described what is at present considered a preferred embodiment of the invention, it will be apparent that many and various changes and modifications may be made with respect to the embodiment illustrated, without departing from the spirit of the invention. It will be understood, therefore, that all such changes and modifications as fall fairly within the scope of the present invention, as defined in the appended claims, are to be considered as a part of the present invention.

What is claimed is:

1. A suppressed carrier modulation device comprising a source of alternating modulation signal; a source of unidirectional voltage; a pair of series connected diode gas discharge electron tubes; a first impedance means connected in series with and between one of said tubes and said voltage source; a second impedance means connected in series with and between the other of said tubes and the other polarity of said voltage source; a capacitor connected in parallel with said tubes forming a relaxation oscillator therewith and providing a source of carrier signal having a greater frequency than said modulation signal; a second capacitor connected to said source of modulation signal; modulation impedance means connected in series with and between said second capacitor and the junction between said diodes; output load means; and a capacitor connecting said output load means to the junction between said diodes and said modulation impedance means to provide an output signal characterized by frequencies consisting of the sum of the carrier and modulation frequencies and the difference between the carrier and modulation frequencies.

2. A suppressed carrier modulation device comprising a source of alternating modulation signal; a source of unidirectional voltage; a pair of series connected diode gas discharge electron tubes; a first impedance means connected in series with and between one of said tubes and said voltage source; a second impedance means connected in series with and between the other of said tubes and said voltage source; a capacitor connected in parallel with said gas tubes forming a relaxation oscillator therewith, providing a source of carrier signal having a greater frequency than said modulation signal; a second capacitor connected to said source of modulation signal; modulation impedance means connected in series with and between said second capacitor and the junction between said diodes; output load means; a capacitor connecting said output load means to the junction between said diodes and said modulation impedance means to provide an output signal characterized by frequencies consisting of the sum of the carrier and modulation frequencies and the difference between the carrier and modulation frequencies; and capacitance means connected to said tubes and adapted to synchronize said oscillator with a predetermined reference signal.

3. A suppressed carrier modulation device comprising: a source of direct voltage; a pair of series connected, bistable impedance means connected in series with said voltage source and characterized by a normally high impedance becoming a substantially decreased low impedance upon the application of a predetermined voltage thereacross; modulation means, for providing a modulation signal, connected in parallel with one of said impedance means and having an intermediate impedance substantially greater than said low impedance; switching impedance means connected in parallel with said bistable means and in series with said voltage source to control the application of said direct voltage across said bistable impedance means, thereby forming an oscillator to provide a source of carrier signal having a frequency greater than said modulation signal; and output load means, connected in parallel with said modulation means, to provide an output signal characterized by frequencies consisting of the sum of the carrier and modulation frequencies and the difference between the carrier and modulation frequencies.

4. A suppressed carrier modulation device comprising: a source of direct voltage; a pair of series connected, bistable impedance means connected in series with said voltage and characterized by a normally high impedance becoming a substantially decreased low impedance upon the application of a predetermined voltage thereacross; modulation means, for providing a modulation signal, connected in parallel with one of said impedance means and having an intermediate impedance substantially greater than said low impedance; switching capacitance means connected in parallel with said bistable impedance means and in series with said voltage source to control the application of said direct voltage across said bistable impedance means, thereby forming a relaxation oscillator to provide a source of carrier signal having a frequency greater than said modulation signal; and output load means, connected in parallel with said modulation means, to provide an output signal characterized by frequencies consisting of the sum of the carrier and modulation frequencies and the difference between the carrier and modulation frequencies.

5. A suppressed carrier modulation device comprising: a source of direct voltage; a pair of series connected, bistable impedance means connected in series with said voltage and characterized by a normally high impedance becoming a substantially decreased low impedance upon the application of a predetermined voltage thereacross; modulation means, for providing a modulation signal, connected in parallel with one of said impedance means and having an intermediate impedance substantially greater than said low impedance; switching impedance means connected in parallel with said bistable impedance means and in series with said voltage source to control the application of said direct voltage across said bistable impedance means, thereby forming an oscillator to provide a source of carrier signal having a frequency greater than said modulation signal; output load means, connected in parallel with said modulation means, to provide an output signal characterized by frequencies consisting of the sum of the carrier and modulation frequencies and the difference between the carrier and modulation frequencies; and means coupled to said bistable impedance means and adapted to couple said oscillator to a source of synchronizing, reference frequency signal.

References Cited in the file of this patent

UNITED STATES PATENTS

| | | |
|---|---|---|
| 1,684,445 | Honaman | Sept. 18, 1928 |
| 2,365,568 | Langer | Dec. 19, 1944 |